United States Patent
Omar et al.

(10) Patent No.: US 9,912,159 B2
(45) Date of Patent: Mar. 6, 2018

(54) METHOD AND APPARATUS FOR DETECTION OF LOCAL LINE PHASE IN A MULTI-PHASE POWER LINE SYSTEM

(71) Applicant: Enphase Energy, Inc., Petaluma, CA (US)

(72) Inventors: Tarik H. Omar, Truckee, CA (US); Madhavi Anugu, San Jose, CA (US); Kennan Laudel, San Jose, CA (US)

(73) Assignee: Enphase Energy, Inc., Petaluma, CA (US)

( * ) Notice: Subject to any disclaimer, the term of this patent is extended or adjusted under 35 U.S.C. 154(b) by 246 days.

(21) Appl. No.: 14/843,180

(22) Filed: Sep. 2, 2015

(65) Prior Publication Data
US 2016/0064937 A1    Mar. 3, 2016

Related U.S. Application Data

(60) Provisional application No. 62/044,660, filed on Sep. 2, 2014.

(51) Int. Cl.
*H02J 3/38*    (2006.01)

(52) U.S. Cl.
CPC ............. *H02J 3/383* (2013.01); *Y02E 10/563* (2013.01)

(58) Field of Classification Search
CPC .......... H02J 3/382; H02J 3/383; Y02E 10/563
USPC ....................................................... 307/104
See application file for complete search history.

(56) References Cited

U.S. PATENT DOCUMENTS

| 9,531,191 B2* | 12/2016 | Belur ................. H02J 3/26 |
| 2008/0180087 A1* | 7/2008 | Pankau ............... H02H 3/253 324/76.74 |
| 2010/0181830 A1 | 7/2010 | Fornage et al. |
| 2011/0267857 A1* | 11/2011 | Fornage ............. H02J 3/005 363/97 |
| 2013/0334888 A1* | 12/2013 | Luo ................... H02J 3/383 307/82 |
| 2014/0203646 A1 | 7/2014 | Belur et al. |

FOREIGN PATENT DOCUMENTS

| EP | 2362519 A2 | 8/2011 |
| KR | 101269659 B1 | 5/2013 |
| WO | WO-2013112304 A1 | 8/2013 |

OTHER PUBLICATIONS

International Search Report and Written Opinion dated Dec. 8. 2015 for PCT Application No. PCT/US2015/048063.

* cited by examiner

*Primary Examiner* — William Hernandez
(74) *Attorney, Agent, or Firm* — Moser Taboada

(57) ABSTRACT

Apparatus and method for determining a phase connection for a power conditioning unit (PCU). In one embodiment, the method comprises determining, by a controller coupled to a multi-phase AC line, a reference phase stamp; determining, by the PCU, a local phase stamp, wherein the PCU is coupled to a subset of phase lines in the multi-phase AC line; determining a difference between the reference phase stamp and the local phase stamp; comparing the difference to one or more of a first range of values or at least a second range of values; and determining the phase connection for the PCU based on whether the difference is within the first range or the at least a second range.

20 Claims, 6 Drawing Sheets

METHOD AND APPARATUS FOR DETECTION OF LOCAL LINE PHASE IN A MULTI-PHASE POWER LINE SYSTEM

CROSS-REFERENCE TO RELATED APPLICATION

This application claims priority to U.S. Provisional Patent Application No. 62/044,660 filed on Sep. 2, 2014, which is herein incorporated in its entirety by reference.

BACKGROUND OF THE INVENTION

Field of the Invention

Embodiments of the present disclosure generally relate to power conversion and, more particularly, to a method and apparatus for determining local phase connections in a multi-phase power line system.

Description of the Related Art

DC-AC inverters convert DC current received from a DC source, such as a renewable energy source, to AC current. One option to use the energy produced is to couple the generated AC current to an AC system such as the commercial power grid.

For inverters that generate one or two phases of AC power and are coupled to a three-phase commercial power grid, the same number (or roughly the same number for large enough systems) of inverters must be coupled to each unique subset of phase lines in the three-phase system in order to produce a balanced three-phase output from the inverters. In order to meet certain relevant safety requirements and/or to implement various features for Advanced Grid Functions (AGF), changes or faults occurring on only one of the three phases may require adjustments by the inverters coupled to one or more of the remaining phases. However, in such a system each inverter only has visibility to those phases to which it is connected; any events occurring on only a single phase line will not be observed by those inverters that are not connected to that phase line.

Therefore, there is a need in the art for a method and apparatus for efficiently determining local phase connections in a multi-phase system.

SUMMARY OF THE INVENTION

Embodiments of the present invention generally relate to a method and apparatus for determining local phase connections substantially as shown and/or described in connection with at least one of the figures, as set forth more completely in the claims.

Various advantages, aspects and novel features of the present disclosure, as well as details of an illustrated embodiment thereof, will be more fully understood from the following description and drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
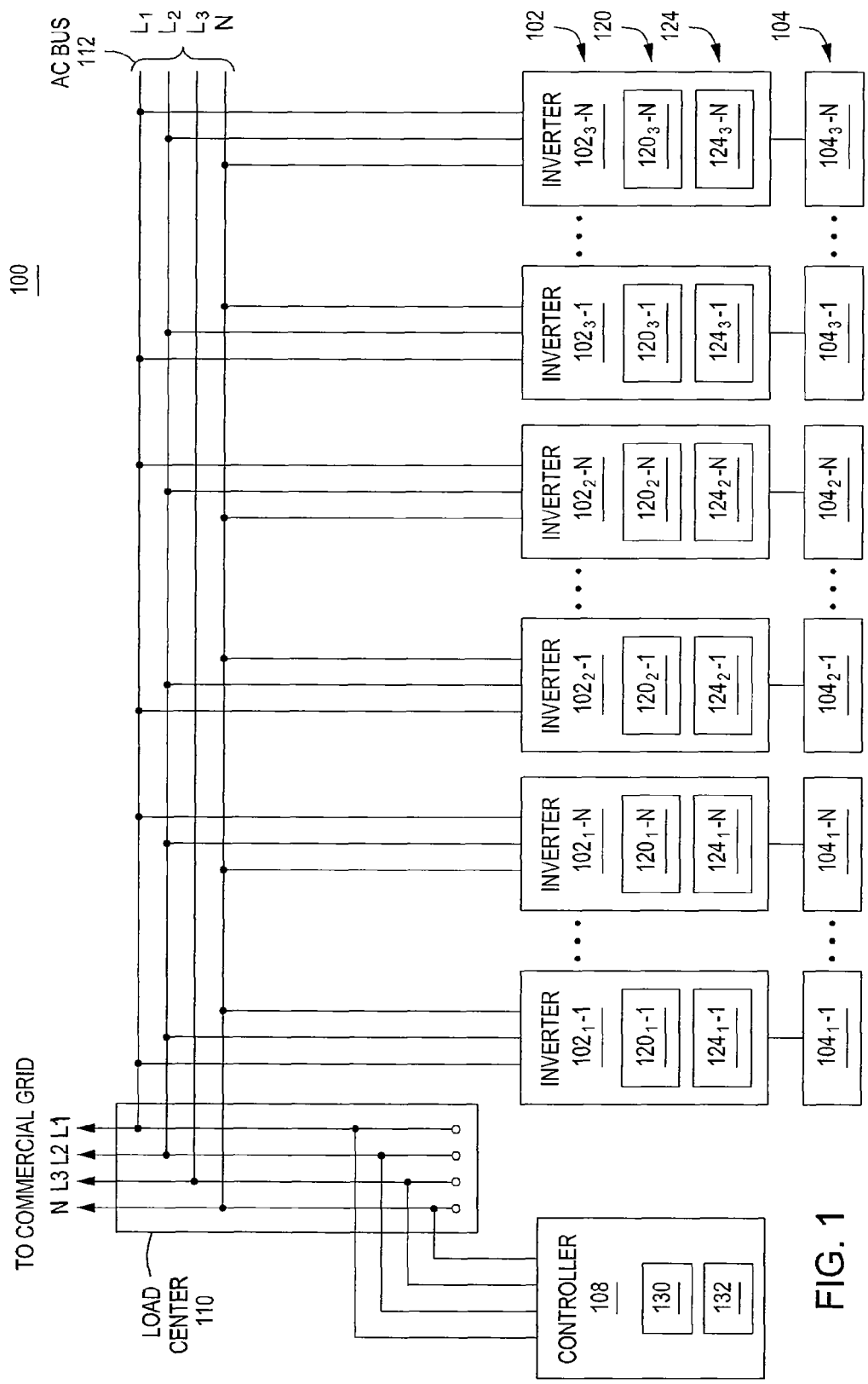
FIG. 1 is a block diagram of a three-phase power generation system in accordance with one or more embodiments of the present invention.

FIG. 1 is a block diagram of a three-phase power generation system 100 in accordance with one or more embodiments of the present invention. This diagram only portrays one variation of the myriad of possible system configurations. The present invention can function in a variety of environments and systems.

The three-phase power generation system 100 ("system 100") comprises a plurality of PV modules $104_M$-1 . . . $104_M$-N (M=1, 2 or 3), collectively referred to as PV modules 104, and a plurality of power conditioning units (PCUs), such as DC-AC inverters $102_M$-1 . . . $102_M$-N (M=1, 2 or 3), collectively referred to as inverters 102. Each inverter $102_M$-1 . . . $102_M$-N is coupled in a one-to-one correspondence to a PV module $104_M$-1 . . . $104_M$-N, respectively, and converts DC power from the corresponding PV module 104 to single-phase AC power that is commercial power-grid compliant. In some other embodiments, one or more of the inverters 102 may be coupled to multiple PV modules 104; additionally or alternatively, one or more of the inverters 102 may receive DC power from a DC source in addition to or other than the PV modules 104, such as one or more other renewable energy sources (e.g., wind farms, hydroelectric systems, or the like), batteries, or any suitable source of DC power.

The inverters 102 are each coupled via a three-phase AC bus 112 to power lines L1, L2, L3, and a neutral line N of a three-phase AC power system at a load center 110. In some embodiments, the three-phase AC power system may be a commercial AC power grid ("grid"), as depicted in FIG. 1. The power lines L1, L2, and L3 are live conductors each carrying a different phase of AC power, where each of the three phases is offset from one another by 120°. As shown in FIG. 1, a first group of inverters $102_1$-1-$102_1$-N is coupled to phase lines L1 and L2; a second group of inverters $102_2$-1-$102_2$-N is coupled to phase lines L1 and L3; and a third group of inverters $102_3$-1-$102_3$-N is coupled to phase lines L2 and L3. Although the same number of inverters 102 is depicted in each of the three groups, for large enough systems the number of inverters 102 coupled to each unique pairing of the phase lines may differ slightly. As further depicted in FIG. 1, each inverter 102 is further coupled to a neutral line N of the grid, although such a neutral line output line is optional and may not be present in some other embodiments.

The AC bus 112 couples a substantially balanced three-phase AC output from the inverters 102 to the grid via the load center 110. A controller 108 is also coupled to the power lines L1, L2, L3, and the neutral line N at the load center 110 and provides operational control and monitoring of the inverters 102 (e.g., activating/deactivating the inverters 102, providing control instructions, receiving alarm and alert messages from the inverters 102, and the like). The controller 108 generally communicates with the inverters 102 via power line communication (PLC) over the AC bus 112, although additionally or alternatively other types of wired and/or wireless communication techniques may be utilized for communication. The controller 108 may further be communicatively coupled to a master controller (not shown), e.g., via the Internet, for sending information to and/or receiving information from the master controller pertaining to operation of the inverters 102. In some embodiments, the controller 108 may be a gateway that sends (e.g., via the Internet) information pertaining to the inverters 102, such as performance data, phase connection information, and the like, to a remote device. In such embodiments, the controller 108 may further communicate data from the remote device to one or more of the inverters 102, such as control commands and the like.

In some other embodiments, the AC power generated by the inverters 102 may additionally or alternatively be coupled to one or more appliances (e.g., at a private residence or business), and/or energy generated by the inverters 102 may be stored for later use (e.g., utilizing batteries, heated water, hydro pumping, $H_2O$-to-hydrogen conversion, or the like.) In one or more alternative embodiments, the PCUs may be DC-AC inverters that convert AC power from an AC line to a DC output; for example, the DC-AC inverter 102 may convert AC power from an AC line (such as the commercial grid) to DC output that is stored in batteries for later use.

In accordance with one or more embodiments of the present invention, the controller 108 broadcasts via PLC a phase awareness packet that is received by each of the inverters 102 for determining which phases each of the inverters 102 is coupled to. The phase awareness packet contains a phase stamp relative to the controller's phase lock loop oscillator; i.e., a snapshot in time of the controller's local phase which also may be referred to as a reference phase stamp. In certain embodiments, a proxy number is used as the reference phase stamp rather than the controller's actual local phase; for example, the reference phase stamp may be set to "zero" or another number in some embodiments.

Upon receiving the phase awareness packet, each inverter 102 extracts the controller's reference phase stamp and compares the reference phase stamp to its own local phase stamp based on its phase lock loop oscillator (i.e., a snapshot of its local phase) to determine a relative difference between the two (i.e., a phase stamp difference). Each inverter 102 responds to the phase awareness packet by transmitting to the controller 108 (via PLC) a phase awareness response packet. Each phase awareness response packet comprises the phase stamp difference with respect to the controller 108 and a particular inverter 102—i.e., an indication of the difference between the controller's phase stamp and the inverter's own phase stamp. Although there may be microdelays in time between the reception of the phase awareness packet among the inverters 102, by communicating via PLC the delays are negligible as compared to the phase rate of change.

The controller 108 receives the phase awareness response packets from the inverters 102 and sorts them into three categories corresponding to each unique pair of grid phase lines—L1-L2, L1-L3, and L2-L3. For example, if the difference between the controller's phase stamp and an inverter's phase stamp is within a first range of values the inverter 102 is determined to be coupled to grid phase lines L1-L2, if the difference between the controller's phase stamp and an inverter's phase stamp is within a second range of values the inverter 102 is determined to be coupled to grid phase lines L1-L3, and if the difference between the controller's phase stamp and an inverter's phase stamp is within a third range of values the inverter 102 is determined to be coupled to grid phase lines L2-L3.

The controller 108 may further generate a mapping between an identification for each inverter 102 and its corresponding local phase line connection; e.g., the controller 108 may create an inverter/phase mapping table comprising a list of inverter serial numbers for each inverter 102 and the corresponding grid phase connections. For those embodiments where the controller's phase stamp is set to a proxy number, the relative phases of the inverters 102 can be determined; in other embodiments where the controller line phase is known, the absolute correlation with the controller's line phase can also be determined.

In some other embodiments, the controller 108 may forward the inverter/phase mapping table, and/or the received differences between the controller's phase stamp and each inverter's phase stamp, to a master controller. Additionally or alternatively, one of the inverters 102 may act as the "host" for generating and broadcasting the initial phase awareness packet; in some of such embodiments, the "host" inverter 102 may also receive the response packets for determining the inverter/phase mapping table. In one or more alternative embodiments, the number of phase lines on the AC power system may be fewer than shown in FIG. 1; for example, in some alternative embodiments the phase connections for single-phase inverters coupled to a two-phase system may be determined.

By determining each inverter's local phase connection and maintaining such information, the controller 108 (and/or a master controller) can then coordinate operation of the inverters 102 among the various phase lines. For example, power levels and/or power factor may be adjusted on a per-line-phase basis, or each of the inverters 102 may be shut-down when a fault occurs on only one of the phase lines L1, L2, or L3.

Figure 2:
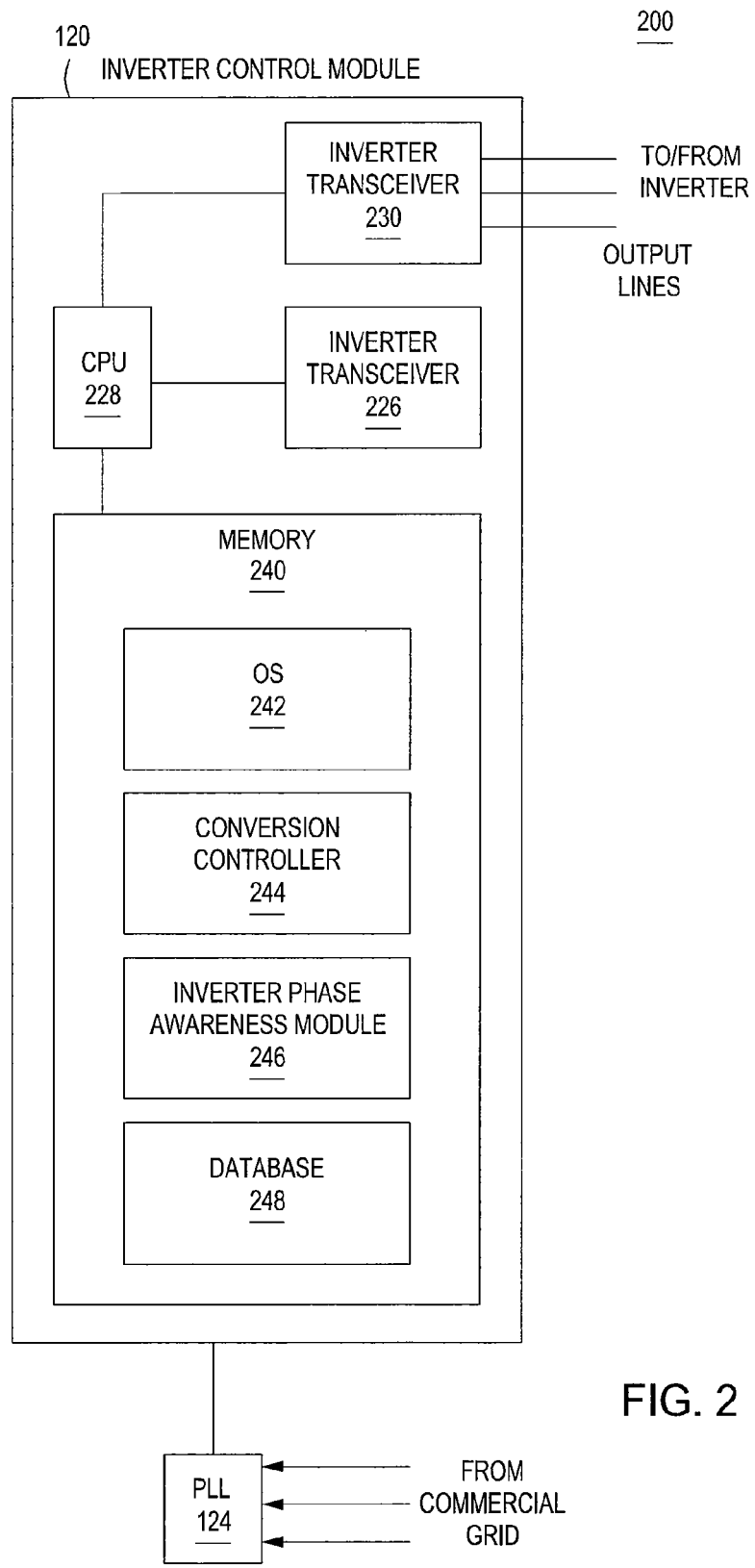
FIG. 2 is a block diagram of an inverter control module coupled to an inverter phase lock loop (PLL) in accordance with one or more embodiments of the present invention.

FIG. 2 is a block diagram of an inverter control module 202 coupled to an inverter phase lock loop (PLL) 204 in accordance with one or more embodiments of the present invention. Each of the inverters 102 comprises a control module 202 for controlling operation of the inverter 102 and a PLL 204 for synchronizing to the grid. The PLL 204 receives samples of the grid voltage (e.g., from a voltage sampler coupled to the grid) and generates a signal indicative of the grid voltage waveform (amplitude, phase and frequency). The PLL 204 couples the generated signal to the inverter control module 202.

The control module 202 comprises at least one central processing unit (CPU) 228 coupled to each of an inverter transceiver 230, support circuits 226, and a memory 240. The inverter transceiver 230 is a power line transceiver and is coupled to the inverter output lines (i.e., the output lines onto which the inverter couples the generated power) for communicatively coupling the inverter 102 to the controller 108 via PLC, although in other embodiments the inverter transceiver 230 may be another type of transceiver for communicating via other types of wired or wireless techniques. In some embodiments, the inverter transceiver 230 may be a power line modem that modulates a signal being transmitted and demodulates a signal being received. In one or more of such embodiments, the PLL 204 is a digital PLL and both the PLL 204 and the power line modem are co-located on the same application specific integrated circuit (ASIC) for performing features of the invention described herein (e.g., receiving the phase awareness packet, extracting the controller's phase stamp, comparing the controller's phase stamp to its own local phase and determining a relative difference between the two, and generating and transmitting a phase response packet).

The CPU 228 may comprise one or more conventionally available microprocessors or digital signal processors (DSPs); additionally or alternatively, the CPU 228 may include one or more ASICs. In some embodiments, the CPU 228 may be a microcontroller comprising internal memory for storing controller firmware that, when executed, provides the controller functionality herein. The support circuits 226 are well known circuits used to promote functionality of the CPU 228. Such circuits include, but are not limited to, a cache, power supplies, clock circuits, buses, network cards, input/output (I/O) circuits, and the like. The control module 202 may be implemented using a general purpose processor that, when executing particular software, becomes a specific purpose processor for performing various embodiments of the present invention.

The memory 240 stores non-transient processor-executable instructions and/or data that may be executed by and/or used by the CPU 228. These processor-executable instructions may comprise firmware, software, and the like, or some combination thereof. The memory 240 may comprise random access memory, read only memory, removable disk memory, flash memory, and various combinations of these types of memory. The memory 240 is sometimes referred to as main memory and may, in part, be used as cache memory or buffer memory. The memory 240 generally stores the operating system (OS) 242 of the control module 202. The OS 242 may be one of a number of commercially available operating systems such as, but not limited to, Linux, Real-Time Operating System (RTOS), and the like.

The memory 240 may store various forms of application software, such as a conversion controller 244 for controlling power conversion by the inverter 102 (e.g., controlling switches in the inverter 102) and a database 248 for storing data related to operation of the inverter 102 and/or the present invention. The memory 240 further comprises an inverter phase awareness module 246 for performing functions related to the present invention as described herein. The inverter transceiver 230, conversion controller 244, inverter phase awareness module 246, and database 248 may be implemented in software, firmware, hardware, or a combination thereof.

Figure 3:
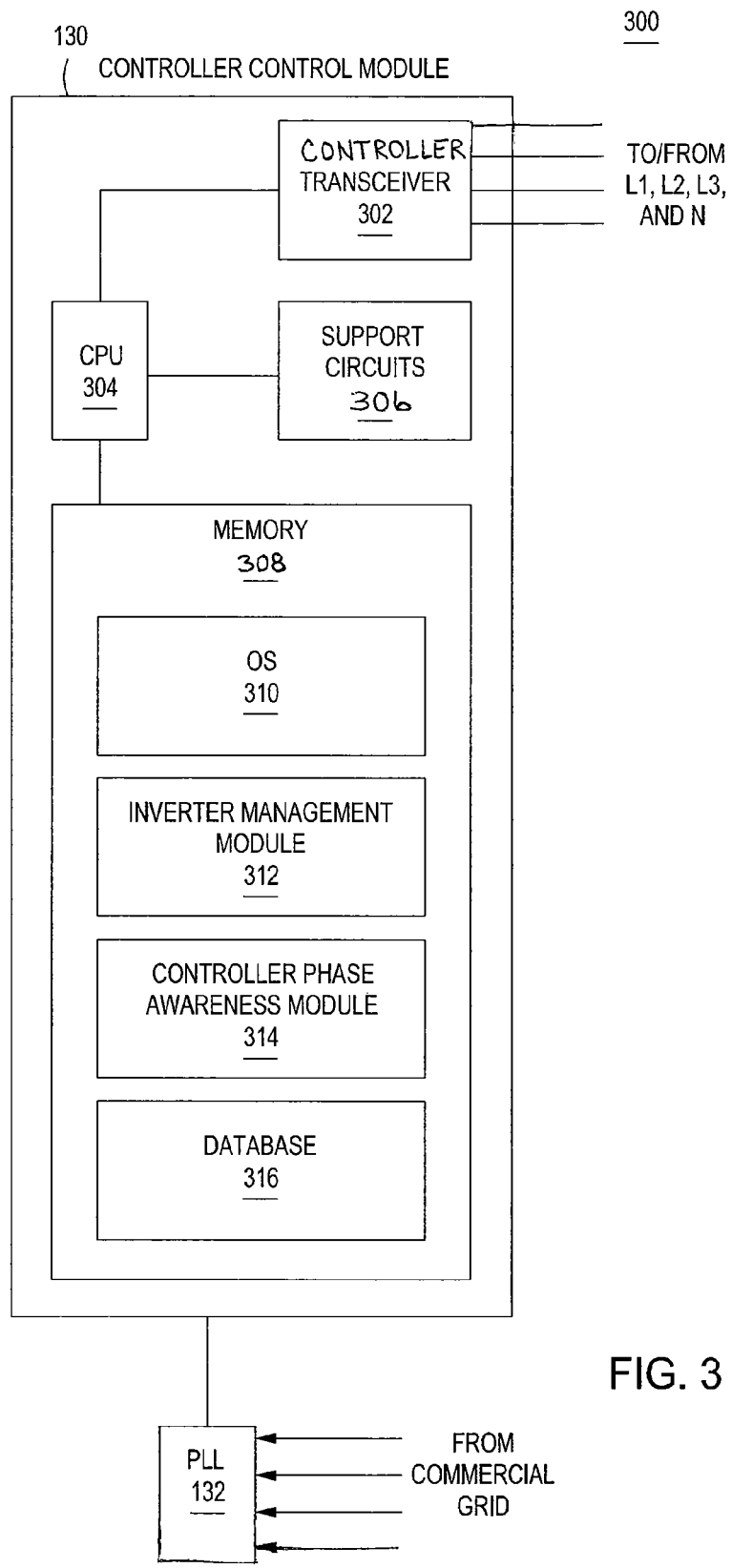
FIG. 3 is a block diagram of a controller control module coupled to a controller phase lock loop (PLL) in accordance with one or more embodiments of the present invention.

FIG. 3 is a block diagram of a controller control module 320 coupled to a controller phase lock loop (PLL) 322 in accordance with one or more embodiments of the present invention. The controller 108 comprises the controller control module 320 for controlling operation of the controller 108 and the PLL 322 for synchronizing to the grid. The PLL 322 receives samples of the grid voltage (e.g., from a voltage sampler coupled to the grid) and generates a signal indicative of the grid voltage waveform (amplitude, phase and frequency). The PLL 322 couples the generated signal to the controller control module 320.

The controller control module 320 comprises at least one central processing unit (CPU) 304 coupled to each of a controller transceiver 302, support circuits 306, and a memory 308.

The controller transceiver 302 is a power line transceiver and is coupled to power lines L1, L2, L3, and N at the load center 110 for communicatively coupling the controller 108 to the inverters 102. In alternative embodiments, the controller 108 may utilize other wired and/or wireless communication techniques for communicating with the inverters 102. In some embodiments, the controller transceiver 302 may be a power line modem that modulates a signal being transmitted and demodulates a signal being received. In one or more of such embodiments, the PLL 322 is a digital PLL and both the PLL 322 and the power line modem are co-located on the same application specific integrated circuit (ASIC) for performing features of the invention described herein (e.g., determining a reference phase stamp, generating and broadcasting a phase awareness packet containing the reference phase stamp, receiving from each inverter 102 a phase response packet and extracting the information indicating the relative difference between the controller's reference phase stamp and the inverter's local phase stamp).

The CPU 304 may comprise one or more conventionally available microprocessors or digital signal processors (DSPs). Alternatively or additionally, the CPU 304 may include one or more ASICs. In some embodiments, the CPU 304 may be a microcontroller comprising internal memory for storing controller firmware that, when executed, provides the controller functionality herein. The support circuits 306 are well known circuits used to promote functionality of the CPU 304. Such circuits include, but are not limited to, a cache, power supplies, clock circuits, buses, network cards, input/output (I/O) circuits, and the like. The controller control module 320 may be implemented using a general purpose processor that, when executing particular software, becomes a specific purpose processor for performing various embodiments of the present invention.

The memory 308 stores non-transient processor-executable instructions and/or data that may be executed by and/or used by the CPU 304. These processor-executable instructions may comprise firmware, software, and the like, or some combination thereof. The memory 308 may comprise random access memory, read only memory, removable disk memory, flash memory, and various combinations of these types of memory. The memory 308 is sometimes referred to as main memory and may, in part, be used as cache memory or buffer memory. The memory 308 generally stores an operating system (OS) 310 of the controller control module 320. The OS 310 may be one of a number of available operating systems for microcontrollers and/or microprocessors.

The memory 308 may store various forms of application software, such as an inverter management module 312 for operatively controlling the inverters 102 (e.g., activating/deactivating the inverters 102, adjusting power output from one or more inverters 102, and the like). The memory 308 further stores a controller phase awareness module 314 for performing functions related to the present invention as described herein. The memory 308 may further store a database 316 for storing information related to the inverters 102 and/or the present invention, such as identification information for each of the inverters 102 (e.g., inverter serial numbers), an inverter/phase mapping table, and the like. The controller transceiver 302, inverter management module 312, controller phase awareness module 314, and data 316 may be implemented in software, firmware, hardware, or a combination thereof.

In some other embodiments, the controller control module 320 may comprise an additional transceiver for communicating to another device via a communications network, such as the Internet (for example, for commuting to a remote master controller).

Figure 4:
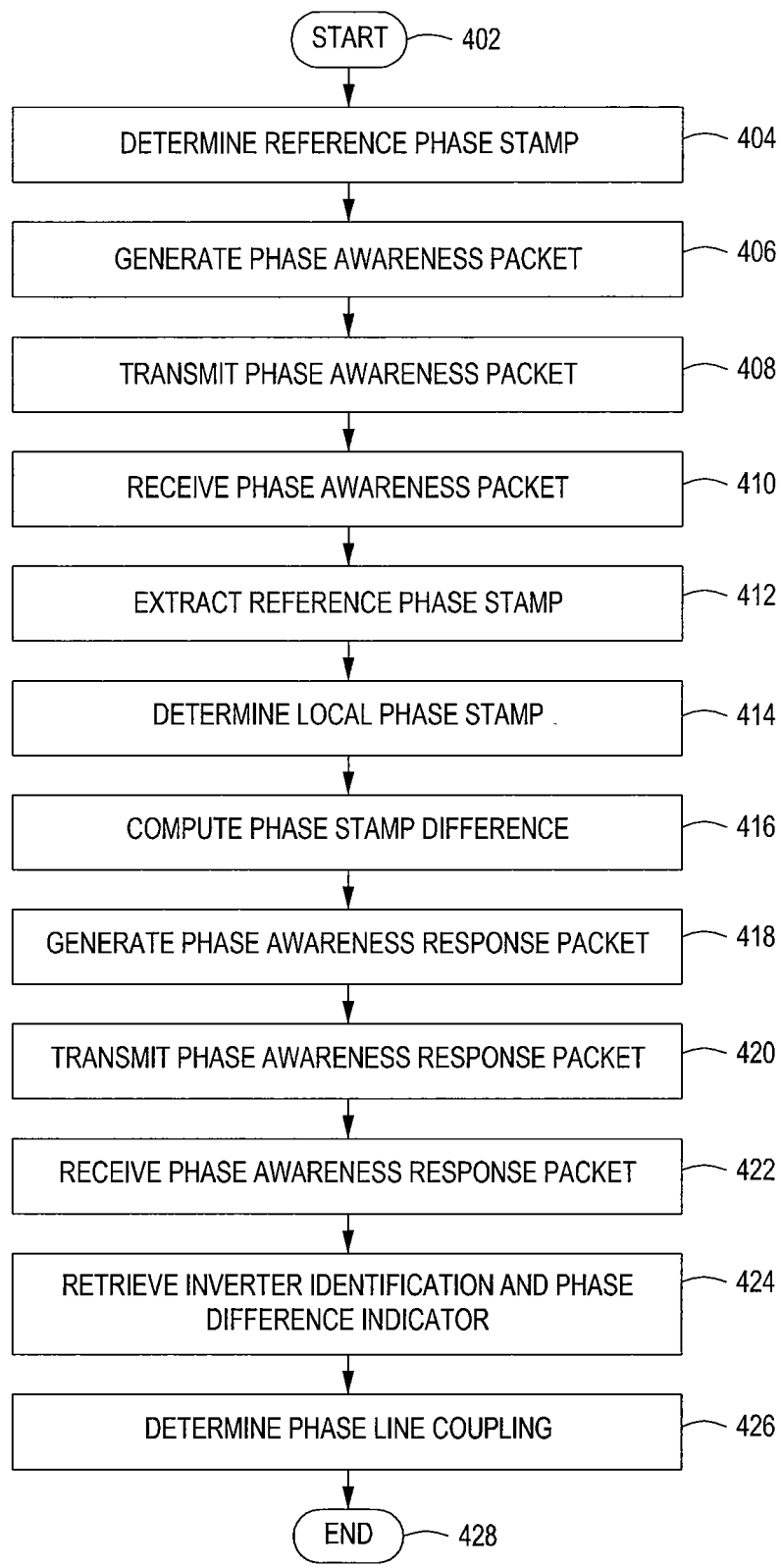
FIG. 4 is a flow diagram of a method for determining a power conditioning unit's phase connection in accordance with one or more embodiments of the present invention.

FIG. 4 is a flow diagram of a method 400 for determining a power conditioning unit's phase connection in accordance with one or more embodiments of the present invention. In some embodiments, such as the embodiment described below, the power conditioning unit (PCU) may be a DC-AC inverter coupled to a multi-phase AC line, such as the DC-AC inverters 102; such a DC-AC inverter may convert received DC power to an AC output and/or convert AC power to a DC output. In one embodiment, the method 400 is an implementation of one or more modules of the inverter control module 120 and the controller control module 130 (e.g., the inverter phase awareness module 246 and the controller phase awareness module 314).

Generally the controller implements steps 404-408 and 422-426 of the method 400 described below, and each inverter of a plurality of inverters that are coupled to multiple phase lines implements steps 410-420. In one or more alternative embodiments, one or more inverters may communicate their local phase stamp to the controller and the controller determines the difference between its own reference phase stamp and each of the inverters' local phase stamps for determining the inverters' local phase connections. In other alternative embodiments, one of the inverters may implement the steps 404-408 and 422-426 or a portion thereof.

The method 400 begins at step 402 and proceeds to step 404, where a reference phase stamp that indicates the controller's local phase is determined. In some embodiments, an indication of the controller's local phase is obtained from a phase lock loop (PLL) of the controller, while in other embodiments a pre-programmed value is used as the reference phase stamp. The method 400 proceeds to step 406 where a phase awareness packet that comprises the reference phase stamp is generated. In some embodiments, the reference phase stamp is an 8-bit digital signal that is sent as the first field of the payload of a phase awareness packet.

At step 408, the phase awareness packet is broadcast to a plurality of inverters that are coupled to multiple phase lines. The controller broadcasts the phase awareness packet using power line communications (PLC), although in one or more alternative embodiments other types or wired or wireless communications may be used. The method 400 proceeds to step 410.

At step 410, an inverter receives the broadcasted phase awareness packet and at step 412, the reference phase stamp is extract from the phase awareness packet. The method 400 proceeds to step 414 where the inverter determines its local phase stamp. The local phase stamp may be obtained by sampling a PLL of the inverter, or a pre-programmed value may be used. Although the steps 410-414 are depicted sequentially, they may take place in any order and two or more of such steps may occur simultaneously.

At step 416, the difference between the reference phase stamp and the inverter's local phase stamp is computed. The method 400 proceeds to step 418 where a phase awareness response packet is generated. The phase awareness response packet comprises an indication of the difference between the reference and the local phase stamps (i.e., a phase stamp difference). At step 420, the phase awareness response packet is transmitted to the controller. Generally, the phase awareness response packet is transmitted via PLC, although other types of wired and/or wireless techniques may be used.

The method proceeds to step 422. At step 422, the phase awareness response packet is received by the controller and at step 424 the phase stamp difference is retrieved from the packet. Additionally, the controller determines a unique identification of the inverter from which the packet was sent. At step 426, the phase line coupling for the inverter is determined based on the phase stamp difference. In order to determine the phase line coupling, the phase stamp difference may be compared to different ranges of values based on the number of phase lines. For example, for a single-phase inverter coupled to a pair of phase lines of a three-phase grid (e.g., as depicted in FIG. 1), the inverter is determined to be coupled to a particular pair of phase lines based on whether the phase stamp difference is within a first range of values, a second range of values, or a third range of values. In one or more embodiments where the controller's reference phase stamp is set to a proxy number, the relative phase of the inverter can be determined; in other embodiments where the controller line phase is obtained using the controller PLL, the absolute correlation with the controller's line phase can be determined.

The controller may further generate a mapping between an identification for the inverter and its corresponding local phase line connection as part of an inverter/phase mapping table comprising a list of inverter identifiers (e.g., serial numbers) and the corresponding phase connections.

The method 400 proceeds from step 426 to step 428 where it ends.

Figure 5:
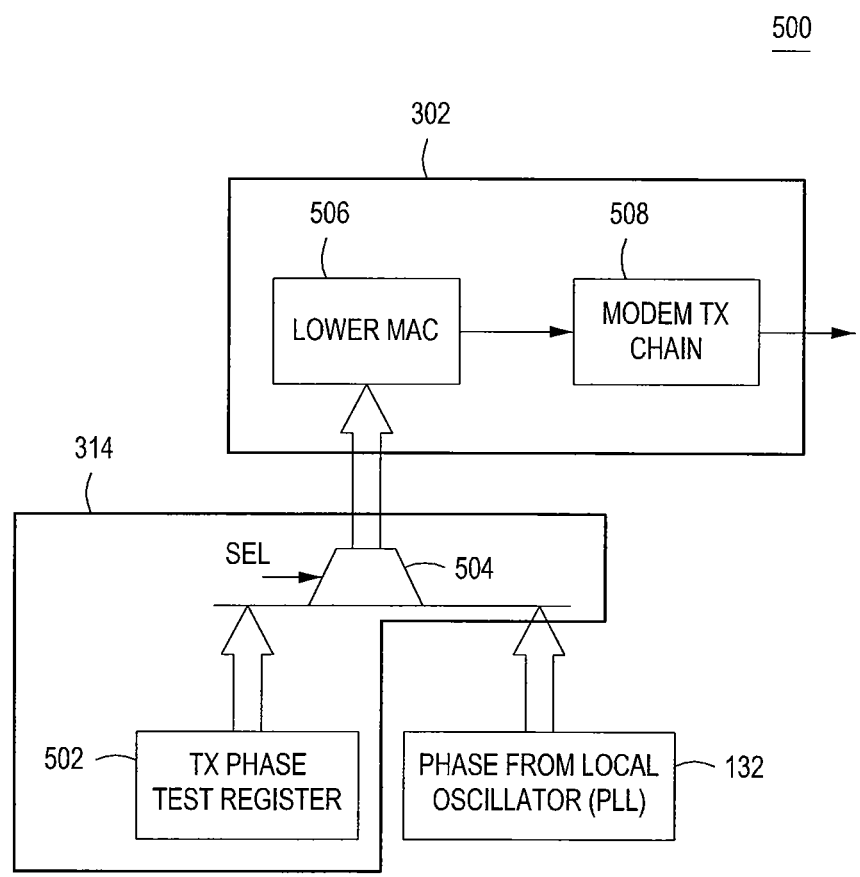
FIG. 5 is a block diagram depicting at least a portion of a controller phase awareness module in accordance with one or more embodiments of the present invention.

FIG. 5 is a block diagram depicting at least a portion of a controller phase awareness module 314 in accordance with one or more embodiments of the present invention. In some embodiments, such as the embodiment depicted in FIG. 5, at least a portion of the controller phase awareness module 314 (as well as other modules or portions of modules, such as the PLL module 132 and the controller transceiver 302) may be implemented in hardware.

In the embodiment depicted in FIG. 5, the controller phase awareness module 312 comprises a transmitter phase test register 502 coupled to a first input of a selector 504. A second input of the selector 504 is coupled to the PLL 132. Based on a selection signal SEL to the selector 504, the selector 504 selects either the sampled PLL phase from the PLL 132 or a pre-programmed value stored in the transmitter phase test register 502 as the controller's reference phase stamp. The selected reference phase stamp from the selector 504 is coupled to a lower MAC 506 of the controller transceiver 302, and the output from the lower MAC 506 is coupled to the modem transmit chain 508 of the controller transceiver 302.

In some embodiments, the reference phase stamp coupled from the selector 504 to the lower MAC 506 is an 8-bit digital signal that is sent as the first field of the payload of a phase awareness packet, although in other embodiments the reference phase stamp may be more of fewer than 8-bits and/or may be located in a different packet position.

Figure 6:
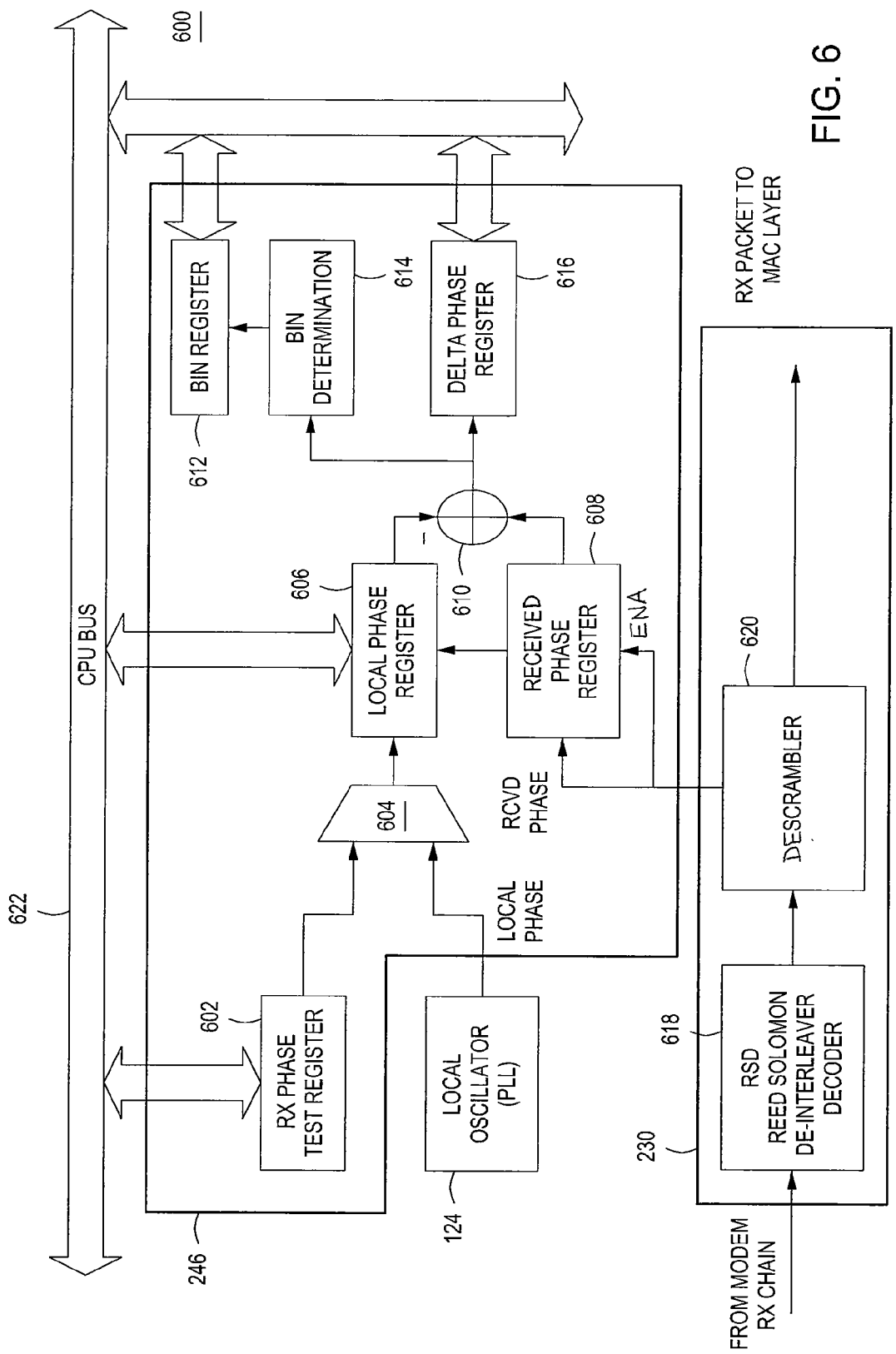
FIG. 6 is a block diagram depicting at least a portion of an inverter phase awareness module in accordance with one or more embodiments of the present invention.

FIG. 6 is a block diagram depicting at least a portion of an inverter phase awareness module 246 in accordance with one or more embodiments of the present invention. In some embodiments, such as the embodiment depicted in FIG. 6, at least a portion of the inverter phase awareness module 246 (as well as other modules or portions of modules, such as the PLL module 124 and the transceiver 230) may be implemented in hardware.

In the embodiment depicted in FIG. 6, the inverter phase awareness module 246 comprises a receiver phase test register 602, a local phase register 606, a bin register 612, and a delta phase register 616, each coupled to a CPU bus

622. The inverter phase awareness module 246 further comprises selector 604, a receiver phase register 608, a subtractor 610, and a "bin" determination 614. The output from the receiver phase test register 602 is coupled to a first input of the selector 604, and a second input to the selector 604 is coupled to the PLL 124. Based on a selection signal to the selector 604, the selector 604 selects either the sampled PLL phase from the PLL 124 or a pre-programmed value stored in the receiver phase test register 602 as the inverter's local phase stamp. The selected inverter phase stamp from the selector 604 is coupled to the local phase register 606 for storing the inverter phase stamp.

In order to determine the difference between the inverter's local phase stamp and the controller's reference phase stamp, the signal from the inverter's modem receiver chain is coupled to a Reed Solomon de-interleaver/decoder 618 of the transceiver 230. From the Reed Solomon de-interleaver/decoder 618, the signal is coupled to a descrambler 620 where the reference phase stamp within the phase aware packet is parsed out and coupled to the received phase register 608. Additionally, the descrambler 620 couples a signal (e.g., an "enable" signal) to the received phase register 608 to enable capture of the controller's reference phase stamp in the received phase register 608. An enable signal is coupled from the received phase register 608 to the local phase register 606 to capture the inverter's local phase stamp from the selector 604.

The inverter's local phase stamp and the controller's reference phase stamp are coupled from the local phase register 606 and the received phase register 608, respectively, to the subtractor 610. The difference between the local and the reference phase stamps (i.e., the phase stamp difference) is coupled to both the delta phase register 616 and the bin determination 614. The bin determination 614 also may be referred to as the phase determination 614; the power line sine-wave is partitioned into 512 "bins", each at a specific phase of the sine-wave and having units of [1/512*2π], although in some alternative embodiments the sine-wave may be partitioned into a different number of bins The output from the bin determination 614 is coupled to the bin register 612. The phase stamp difference can then be transmitted from the inverter 102 to the controller 108 for determining the inverter's local phase connection as previously described.

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is determined by the claims that follow.

The invention claimed is:

1. A method for determining a phase connection for a power conditioning unit (PCU), comprising:
    determining, by a controller coupled to a multi-phase AC line, a reference phase stamp;
    determining, by the PCU, a local phase stamp, wherein the PCU is coupled to a subset of phase lines in the multi-phase AC line;
    determining a difference between the reference phase stamp and the local phase stamp;
    comparing the difference to one or more of a first range of values or at least a second range of values; and
    determining the phase connection for the PCU based on whether the difference is within the first range or the at least a second range.

2. The method of claim 1, further comprising communicating, from the controller to the PCU, the reference phase stamp, wherein the PCU determines the difference.

3. The method of claim 2, further comprising communicating, from the PCU to the controller, the difference.

4. The method of claim 3, wherein communicating the reference phase stamp and communicating the difference are done using power line communications (PLC).

5. The method of claim 1, wherein the controller determines the reference phase stamp using a phase lock loop (PLL).

6. The method of claim 1, wherein the controller uses a pre-determined value for the reference phase stamp.

7. The method of claim 1, wherein the multi-phase AC line is a three-phase power grid.

8. An apparatus for determining a phase connection for a power conditioning unit (PCU), comprising:
    the PCU, coupled to a subset of phase lines in a multi-phase AC line; and
    a controller, coupled to the multi-phase AC line, for (i) determining a reference phase stamp, (ii) communicating the reference phase stamp to the PCU, (iii) receiving from the PCU a phase stamp difference that indicates a difference between the reference phase stamp and a local phase stamp of the PCU, (iv) comparing the phase stamp difference to one or more of a first range of values or at least a second range of values, and (v) determining the phase connection based on whether the phase stamp difference is within the first range or the at least a second range.

9. The apparatus of claim 8, wherein the PCU determines the local phase stamp, determines the difference, and communicates the difference to the controller.

10. The apparatus of claim 9, wherein the controller communicates the reference phase stamp to the PCU using power line communications (PLC) and the PCU communicates the difference to the controller using PLC.

11. The apparatus of claim 8, wherein the controller determines the reference phase stamp using a phase lock loop (PLL).

12. The apparatus of claim 8, wherein the controller uses a pre-determined value for the reference phase stamp.

13. The apparatus of claim 8, wherein the multi-phase AC line is a three-phase power grid.

14. A system for determining phase connections for power conditioning units (PCUs), comprising:
    a plurality of PCUs, each PCU of the plurality of PCUs coupled to a subset of phase lines in a multi-phase AC line; and
    a controller, coupled to the multi-phase AC line, for (i) determining a reference phase stamp, (ii) communicating the reference phase stamp to the plurality of PCUs, (iii) receiving, from each PCU of the plurality of PCUs, a phase stamp difference that indicates a difference between the reference phase stamp and a local phase stamp of the PCU, (iv) comparing, for the phase stamp difference received from each PCU of the plurality of PCUs, the phase stamp difference to one or more of a first range of values or at least a second range of values, and (v) determining, for each PCU of the plurality of PCUs, a phase connection based on whether the phase stamp difference is within the first range or the at least a second range.

15. The system of claim 14, wherein, for each PCU of the plurality of PCUs, the PCU determines the local phase stamp, determines the difference, and communicates the difference to the controller.

16. The system of claim 15, wherein the controller communicates the reference phase stamp to the plurality of PCUs using power line communications (PLC) and, for each PCU of the plurality of PCUs, the PCU communicates the difference to the controller using PLC.

17. The system of claim 14, wherein the controller determines the reference phase stamp using a phase lock loop (PLL).

18. The system of claim 14, wherein the controller uses a pre-determined value for the reference phase stamp.

19. The system of claim 14, wherein the multi-phase AC line is a three-phase power grid.

20. The system of claim 14, wherein the controller generates a mapping identifying, for each PCU of the plurality of PCUs, the PCU and the corresponding phase connection.

* * * * *